United States Patent
Thaveeprungsriporn et al.

(10) Patent No.: US 7,489,493 B2
(45) Date of Patent: Feb. 10, 2009

(54) METHOD TO FORM ELECTROSTATIC DISCHARGE PROTECTION ON FLEXIBLE CIRCUITS USING A DIAMOND-LIKE CARBON MATERIAL

(75) Inventors: Visit Thaveeprungsriporn, Bangkok (TH); Szu-Han Hu, Bangkok (TH)

(73) Assignee: Magnecomp Corporation, Temecula, CA (US)

(*) Notice: Subject to any disclaimer, the term of this patent is extended or adjusted under 35 U.S.C. 154(b) by 255 days.

(21) Appl. No.: 10/864,073

(22) Filed: Jun. 8, 2004

(65) Prior Publication Data

US 2005/0117257 A1  Jun. 2, 2005

Related U.S. Application Data

(60) Provisional application No. 60/538,798, filed on Jan. 23, 2004, provisional application No. 60/526,164, filed on Dec. 1, 2003.

(51) Int. Cl.
*H05F 3/02* (2006.01)
(52) U.S. Cl. .................................... 361/220
(58) Field of Classification Search ............ 361/220
See application file for complete search history.

(56) References Cited

U.S. PATENT DOCUMENTS

| | | | |
|---|---|---|---|
| 3,652,037 A | 3/1972 | Dolby | |
| 4,231,154 A | 11/1980 | Gazdik et al. | |
| 4,383,728 A | 5/1983 | Litington | |
| 4,400,410 A | 8/1983 | Green et al. | |
| 4,480,288 A | 10/1984 | Gazdik et al. | |
| 4,504,410 A | 3/1985 | Hempel et al. | |
| 4,576,964 A | 3/1986 | Eggler et al. | |
| 4,698,256 A | 10/1987 | Giglia et al. | |
| 4,746,538 A | 5/1988 | Mackowski | |
| 4,809,876 A | 3/1989 | Tomaswick et al. | |
| 4,818,827 A * | 4/1989 | Ipcinski et al. | ............... 200/5 A |
| 4,914,551 A | 4/1990 | Anschel et al. | |

(Continued)

FOREIGN PATENT DOCUMENTS

EP   0 615 257 A2   9/1994

(Continued)

OTHER PUBLICATIONS

HTI Feature Concept: HTI Anti-Static Coatings, Specification Sheet, Hutchinson Technology, Inc. Sep. 2003.

(Continued)

*Primary Examiner*—Stephen W Jackson
*Assistant Examiner*—Ann T Hoang
(74) *Attorney, Agent, or Firm*—Intellectual Property Law Office of Joel D. Voelzke

(57) ABSTRACT

Techniques for preventing electrostatic discharge (ESD) and circuit noise are provided. More particularly, the present invention provides a method to prevent ESD damage during the assembly of computer disk commonly called a hard disk for memory applications. The coating mainly involves a ion-deposition process. Merely by way of example, the present invention is implemented by using filtered cathodic vacuum arc (FCVA) with a dissipative crystalline and/or amorphous carbon base thin film coating on a flexible circuit to drain the potential electrostatic charges during circuit assembly and interconnect processes, yet it would be recognized that the invention has a much broader range of applicability on any electronic apparatus that is susceptible to electrostatic damage and static noise.

23 Claims, 5 Drawing Sheets

U.S. PATENT DOCUMENTS

| | | |
|---|---|---|
| 5,091,229 A | 2/1992 | Golike et al. |
| 5,227,008 A | 7/1993 | Klun et al. |
| 5,401,913 A | 3/1995 | Gerber et al. |
| 5,465,186 A | 11/1995 | Bajorek et al. |
| 5,478,616 A | 12/1995 | Kochem et al. |
| 5,508,071 A | 4/1996 | Banholzer et al. |
| 5,508,092 A | 4/1996 | Klimock et al. |
| 5,559,367 A | 9/1996 | Cohen et al. |
| 5,612,840 A | 3/1997 | Hiraoka et al. |
| 5,643,343 A | 7/1997 | Selifanov et al. |
| 5,666,717 A | 9/1997 | Matsumoto et al. |
| 5,680,274 A | 10/1997 | Palmer |
| 5,707,409 A | 1/1998 | Martin et al. |
| 5,710,682 A | 1/1998 | Arya et al. |
| 5,761,009 A | 6/1998 | Hughbanks et al. |
| 5,792,558 A | 8/1998 | Jonas et al. |
| 5,796,570 A | 8/1998 | Mekdhanasarn et al. |
| 5,858,477 A * | 1/1999 | Veerasamy et al. .......... 427/562 |
| 6,015,509 A | 1/2000 | Angelopoulos et al. |
| 6,046,886 A | 4/2000 | Himes et al. |
| 6,049,041 A | 4/2000 | Yoshioka et al. |
| 6,099,757 A | 8/2000 | Kuikarni |
| 6,125,015 A | 9/2000 | Carlson et al. |
| 6,146,813 A | 11/2000 | Girard et al. |
| 6,316,734 B1 | 11/2001 | Yang |
| 6,326,553 B1 * | 12/2001 | Yim et al. ................... 174/254 |
| 6,387,443 B1 * | 5/2002 | Shi et al. ................... 428/408 |
| 6,399,899 B1 | 6/2002 | Ohkawa et al. |
| 6,459,043 B1 | 10/2002 | Dodsworth |
| 6,493,198 B1 * | 12/2002 | Arledge et al. ................ 361/56 |
| 6,576,148 B1 | 6/2003 | Shum et al. |
| 6,586,041 B1 | 7/2003 | Ibar |
| 6,631,052 B1 | 10/2003 | Girard et al. |
| 6,658,722 B1 | 12/2003 | Kurita et al. |
| 6,669,871 B2 * | 12/2003 | Kwon et al. ........... 252/520.21 |
| 6,680,824 B2 | 1/2004 | Kamigama et al. |
| 6,700,747 B2 | 3/2004 | Matz |
| 6,704,165 B2 | 3/2004 | Kube et al. |
| 6,762,913 B1 * | 7/2004 | Even et al. ................... 360/246 |
| 6,774,489 B2 * | 8/2004 | Russell et al. ................ 257/752 |
| 6,801,402 B1 | 10/2004 | Subrahmanyam et al. |
| 6,853,036 B1 * | 2/2005 | Rodov et al. ................ 257/355 |
| 6,995,954 B1 * | 2/2006 | Coon ...................... 360/245.9 |
| 7,079,357 B1 | 7/2006 | Kulangara et al. |
| 7,142,395 B2 | 11/2006 | Swanson et al. |
| 2002/0139569 A1 | 10/2002 | Dodsworth |
| 2003/0062194 A1 | 4/2003 | Dodsworth et al. |
| 2005/0045374 A1 * | 3/2005 | Kumar et al. ............... 174/254 |

FOREIGN PATENT DOCUMENTS

| | | |
|---|---|---|
| EP | 0 717 418 A2 | 6/1996 |
| EP | 1 178 715 A2 | 2/2002 |
| JP | 02-273314 A | 11/1990 |
| JP | 3119612 | 5/1991 |
| JP | 08-249849 A | 9/1996 |
| JP | 10329468 | 12/1998 |
| JP | 11-250434 A | 9/1999 |
| JP | 2000-011337 A | 1/2000 |

OTHER PUBLICATIONS

ST-Poly, Central Corporation, ST-Poly Technical Data, http://www.central-corp.com/stpoly/whatisstpoly/index.htm, pp. 1-7, printed Dec. 14, 2004.

Coon, Warren, U.S. Appl. No. 10/194,643, filed on Jul. 11, 2002.

* cited by examiner

METHOD TO FORM ELECTROSTATIC DISCHARGE PROTECTION ON FLEXIBLE CIRCUITS USING A DIAMOND-LIKE CARBON MATERIAL

CROSS-REFERENCES TO RELATED APPLICATIONS

This application claims priority from U.S. provisional patent application No. 60/526,164, filed Dec. 1, 2003, entitled "Method for Electro Static Discharge Protection and Noise Reduction of Flexible Circuit by Applying Carbon Base Coating," and U.S. provisional patent application No. 60/538,798, filed Jan. 23, 2004, entitled "Method to Form Electrostatic Discharge Protection on Flexible Circuits," which disclosures are incorporated herein by reference.

BACKGROUND OF THE INVENTION

This invention generally relates to techniques for forming electrostatic discharge (ESD) protection for a computer disk, commonly called a hard disk drive (HDD), throughout its assembly process. More particularly, the present invention provides robust methods and dry processes for preventing electrostatic discharge and circuit noise induced by circuit handling during HDD assembly. Merely by way of example, the present invention is implemented using such methods and processes with a dissipative carbon base thin film coating on a flexible circuit to drain the potential electrostatic charge during circuit assembly and interconnect processes, yet it would be recognized that the invention has a much broader range of applicability on any electronic apparatus that is susceptible to electrostatic damage and static noise.

Nowadays, a HDD uses a magnetoresistive thin film element (MR Head) to perform data read/write operation. The MR Head is bonded on a slider and then connected to a flex circuit for data transmission. A suspension provides a platform for this architecture that forms a head gimbal assembly (HGA). Production yield of this assembly is critical for overall HDD cost margin. Yet, this thin film head element is susceptible to low voltage ESD damage, and the signal is susceptible to static noise distortion.

The common protection tactics are to coat dissipative polymer film on circuits to drain out potential charges and/or ground the slider with conductive material to minimize noise. However, these tactics have disadvantages. For example, due to the natural properties of the polymer film, the resistance and thickness uniformity of the polymer film are hard to control. Furthermore, the polymer film suffers from environmental attack (e.g., temperature, humidity, etc.) and requires curing time. With respect to techniques of grounding the slider, they have the disadvantage of high cost due to forming the grounding feature on circuit by sputtering and/or deep-hole plating followed by nickel (Ni) and gold (Au) plating. Other techniques using solder or conductive epoxy have high ground resistance due to the presence of oxide on the ground plane surface.

The HDD industry has long sought a clean, low cost, and robust coating to perform the ESD protection and noise reduction. Thus, there is a great need for a robust and low cost solution.

BRIEF SUMMARY OF THE INVENTION

According to the present invention, techniques for preventing ESD and circuit noise are provided. More particularly, the present invention provides a method to prevent ESD damage during the assembly of a HDD. The coating mainly involves an ion-deposition process, for example, filtered cathodic vacuum arc (FCVA). Merely by way of example, the present invention is implemented by using FCVA with a dissipative carbon base thin film coating on a flexible circuit to drain the potential electrostatic charges during circuit assembly and interconnect processes, yet it would be recognized that the invention could use other ion-deposition processes (for example, sputtering, single or dual ion beam, laser ablation, etc.) and have a much broader range of applicability on any electronic apparatus that is susceptible to electrostatic damage and static noise.

In a specific embodiment, low cost and robust carbon base film coating (for example, tetrahedral amorphous carbon (TAC)) is used for circuit ESD protection. TAC is conventionally used as a machine tool and die coating to improve surface wear resistance. However, TAC can be formulated to exhibit resistivity in the order of $10^8$ to $10^{-2}$ ohms. For circuit electrostatic dissipation, a TAC film is formulated to about $10^6$ to $10^8$ ohms as electrically dissipative material and coated on circuit surface. Film deposition can be implemented by FCVA or another ion-deposition process.

In an alternative embodiment, a robust connection to ground for noise reduction is provided. TAC can be formulated to have low resistance (or its lowest resistance) for use as a ground connection (or a grounding feature), thereby providing good conductivity to ground. Besides TAC, the ground connection can also be formed by other metallic materials by using the same deposition process used for the dissipative film coating or another deposition process.

The FCVA technique provides ion deposition without the cost of using noble gases and the resulting TAC film exhibits high density and excellent surface wear resistance. The film thickness can be controlled in the range of a nanometer to micrometers. The film thickness, in an embodiment of the invention, can be 1 nm, 5 nm, 10 nm, or greater. The coating area can be selective, by applying either a rigid (or flexible metallic) mask or solvent removable/wet etchable polyimide.

Numerous benefits are achieved using the present invention over conventional techniques. For example, the present invention can be implemented by using existing fabrication technologies, such as FCVA. The invention can also be easily manufactured and applied according to certain embodiments. Depending upon the embodiment, one or more of these benefits may be realized. These and other benefits are described throughout the present specification and more particularly below.

1. Dry process.
2. Process simplicity.
3. Small floor area required.
4. Low temperature process.
5. Equipment involved is capable for 10K class clean room process.
6. The process can be separated from circuit manufacturing, as an add-on process.
7. Clean process, no chemical waste.
8. No curing required.
9. No outgassing concern.
10. Low particle count.
11. Allow selective coating area.
12. Allow low cost mask material, such as stainless steel.
13. Allow batch process for high volume production.
14. Low cycling time and low material cost.
15. No noble gas consumption.
16. Excellent electrical resistance control.
17. Excellent thickness control.
18. Excellent surface wear resistance.

19. High density and uniform film deposition.
20. Direct deposition on polyimide without forming of seed layers.
21. Good interface bonding strength.
22. Low residual stress.
23. Capable to process variety of low particle count metallic and non-metallic material.
24. Coating integrity and performance do not degrade by environmental attack.

As an example, the inventors demonstrated the invention using a flexible circuit with an electrostatic coating in accordance with an embodiment of the invention. The results are as follow:

1. Film thickness: 5 to 50 nm (controllable).
2. Dissipative resistance: $10^6$ to $10^8$ ohms (controllable).
3. Conductive resistance: less than $10^{-1}$ ohms.
4. Tribocharge: less than 8 volt (dependent on coating resistance control).
5. Static decay (1,000 volt charge with 10% cut-off): less than 0.3 seconds.

Test results from an environmental attack of 80° C./85% RH for 120 hours and ultrasonic cavitations of 68 kHz/185 W for 90 minutes showed no significant change in the flexible circuit with an electrostatic coating in accordance with an embodiment of the invention.

In an embodiment according to the present invention, a flexible circuit for electrostatic discharge protection includes a first dielectric layer over a ground plane, at least one trace conductor on a surface of the first dielectric layer, a second dielectric layer over the at least one trace conductor and the first dielectric layer, and a carbon base film coating deposited over the second dielectric layer. The carbon base film coating can be an amorphous carbon base material, crystalline carbon base material, or a combination of amorphous and crystalline carbon base material.

In an another embodiment, a flexible circuit for electrostatic noise protection includes a dielectric layer over a ground plane, a trench extending in the dielectric layer to the ground plane, at least one trace conductor on a surface of the dielectric layer, and a film coating deposited over the at least one trace conductor and trench. The at least one trace conductor is coupled to the ground plane through the film coating.

In yet another embodiment, a flexible circuit for electrostatic noise and discharge protection of a computer disk is formed. The flexible circuit, in panel form, is provided. A surface of the flexible circuit is cleaned. A first mask is applied to the surface of the flexible circuit, and a conductive material is deposited by a first ion-deposition process onto the surface of the flexible circuit to form a ground path. A second mask is applied to the surface of the flexible circuit, and a dissipative material is deposited on the surface of the flexible circuit by a second ion-deposition process. An ion-deposition process can have a peak energy level of at least 1 eV and a pressure of lower than $10^{-3}$ Torr. The dissipative material can be an amorphous carbon base material, a crystalline carbon base material, or a combination of amorphous and crystalline carbon base material.

Various additional objects, features and advantages of the present invention can be more fully appreciated with reference to the detailed description and accompanying drawings that follow.

DETAILED DESCRIPTION OF THE INVENTION

According to the present invention, techniques for preventing ESD and circuit noise are provided. More particularly, the present invention prevents ESD damage during the assembly of HDD. As an embodiment according to the present invention, a dissipative carbon base thin film is coated on a flexible circuit to drain the potential electrostatic charges during circuit assembly and interconnect processes. The coating is formed by using a FCVA process. Yet, it would be recognized that the invention could use other ion-deposition processes and have a much broader range of applicability on any electronic apparatus that are susceptible to electrostatic damage and static noise.

Figure 1:
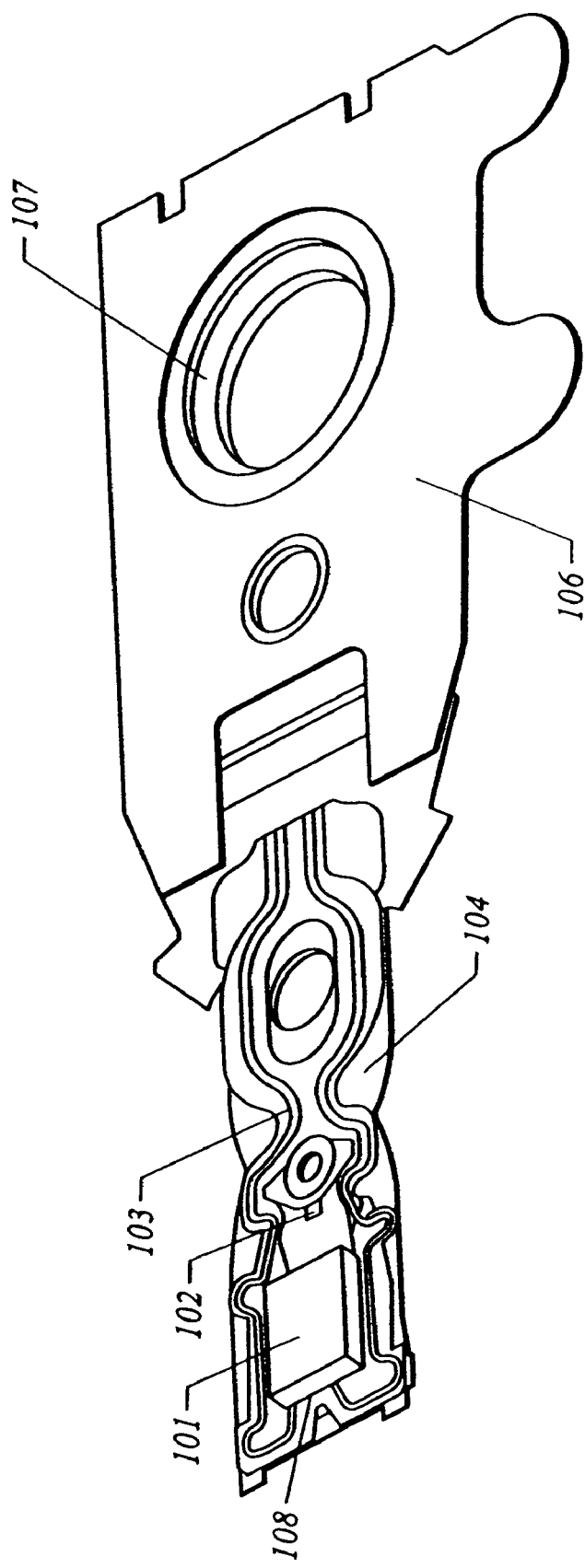
FIG. 1 is a simplified diagram of head gimbal assembly (HGA) according to an embodiment of the invention.

FIG. 1 is a head gimbal assembly (HGA) top-view diagram. As shown, the apparatus includes a MR head 108 on a slider 101 and is bonded on gimbal 102 by adhesives. The interconnect is formed by connecting the MR head 108 to a flexible circuit 103. This flexible circuit is then routed on a suspension load beam 104 through hinge area 107 and base plate 106 all the way to the preamp chip (not shown) on a head suspension assembly (HSA). This diagram is merely an example, which should not unduly limit the scope of the claims herein. One of ordinary skill in the art would recognize many other variations, modifications, and alternatives.

MR Head 108 performs data read/write operations for the HDD. The MR Head 108, bonded on a slider 101, is connected to flexible circuit 103 for data transmission. A suspension provides a platform for this architecture that forms a HGA. HGA may be stacked up to form a HSA along with a motorized actuator. Production yield of this assembly is critical for overall HDD cost margin. Yet, MR Head 108 is susceptible to low voltage ESD damage, and the signal is susceptible to static noise distortion. Most likely, the MR head 108 is the most susceptible element on the HSA for an ESD event. During slider 101 bonding and the interconnect processes, an ESD event could happen anytime and cause damage to MR Head 108.

Figure 2:
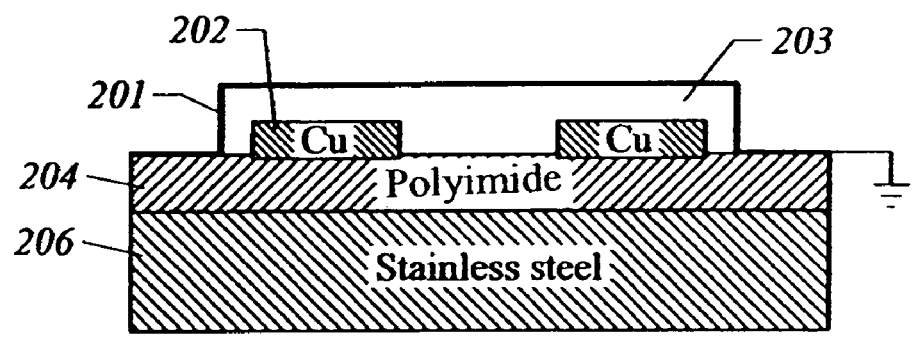
FIG. 2 is a simplified diagram of a cross-section of a flexible circuit with an electrically dissipative tetrahedral amorphous carbon coating, according to an embodiment of the invention, to drain electrostatic charges.

As an embodiment according to the present invention, FIG. 2 is a simplified, cross-sectional diagram of a flexible circuit with electrostatic protection coat. As shown, the flexible circuit includes a ground plane 206 and a dielectric layer 204 underneath trace conductors 202. The conductors 202 are covered by a thin layer of dielectric 203 for impedance management and environmental protection. A controlled dimension TAC film 201 (normally in the order of $10^{-9}$ meters) is deposited on top of the cover dielectric 203. Although TAC is conventionally used for machine tool and die coating to improve surface wear resistance, TAC can be formulated to exhibit resistance in the order of about $10^8$ to $10^{-2}$ ohms. For circuit electrostatic dissipation, the TAC film 201 can be formulated to about $10^6$ to $10^8$ ohms as electrically dissipative material and coated on circuit surface 201 using a FCVA process with a peak energy of at least 1 eV and a pressure of less than $10^{-3}$ Torr. In alternative embodiments, other carbon base film coatings can be used instead of TAC film 201. The carbon base film coating can include amorphous carbon base material, crystalline carbon base material, or a combination of amorphous and crystalline carbon base material.

Figure 3:
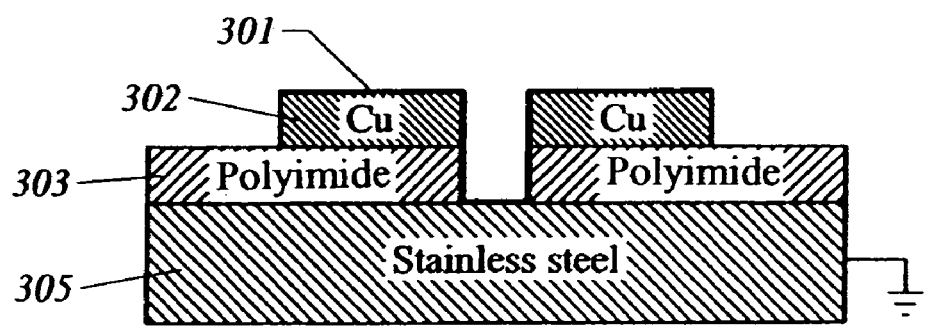
FIG. 3 is a simplified diagram of a cross-section of a grounding feature with electrically conductive tetrahedral amorphous carbon coating, according to an embodiment of the invention, to minimize noise caused by electrostatic charges.

FIG. 3 is a simplified, cross-sectional diagram of a flexible circuit with ground connection according to an embodiment of the invention. As shown, the flexible circuit includes a ground plane 305 and a dielectric layer 303 underneath of trace conductors 302. A controlled dimension TAC coat 301 (normally in the order of $10^{-6}$ meter) is deposited to connect the conductor 302 to the ground plane 305 to form a ground path on the flexible circuit. TAC can be formulated to exhibit resistance in the order of $10^8$ to $10^{-2}$ ohms. For circuit electrostatic dissipation, the film is formulated to the lowest resistance to be electrically conductive material and coated on a special ground feature. Depending upon the embodiment, metallic materials could be candidates to serve this purpose as well, such as titanium, copper, nickel, chromium, silver, gold, etc. The connection formation technique used is FCVA, although in alternative embodiments other ion-deposition processes can be used.

A method according to an embodiment of the present invention may be outlined as follows:
1. Provide flexible circuit in panel form.
2. Surface preparation (for example, cleaning the surface, such as removal of particles, organic materials, etc.) by using FCVA chamber.
3. Apply mask and alignment.
4. Deposit conductive material to form the ground path by FCVA.
5. Apply another mask and alignment.
6. Deposit dissipative material to form an ESD protection film by FCVA.

In the event a ground feature is not needed, then process steps 3 and 4 above can be eliminated. The above sequence of steps provides a method according to an embodiment of the present invention. As shown, the method includes using FCVA to deposit films with appropriate resistivity to protect an electronic apparatus against ESD.

Figure 4:
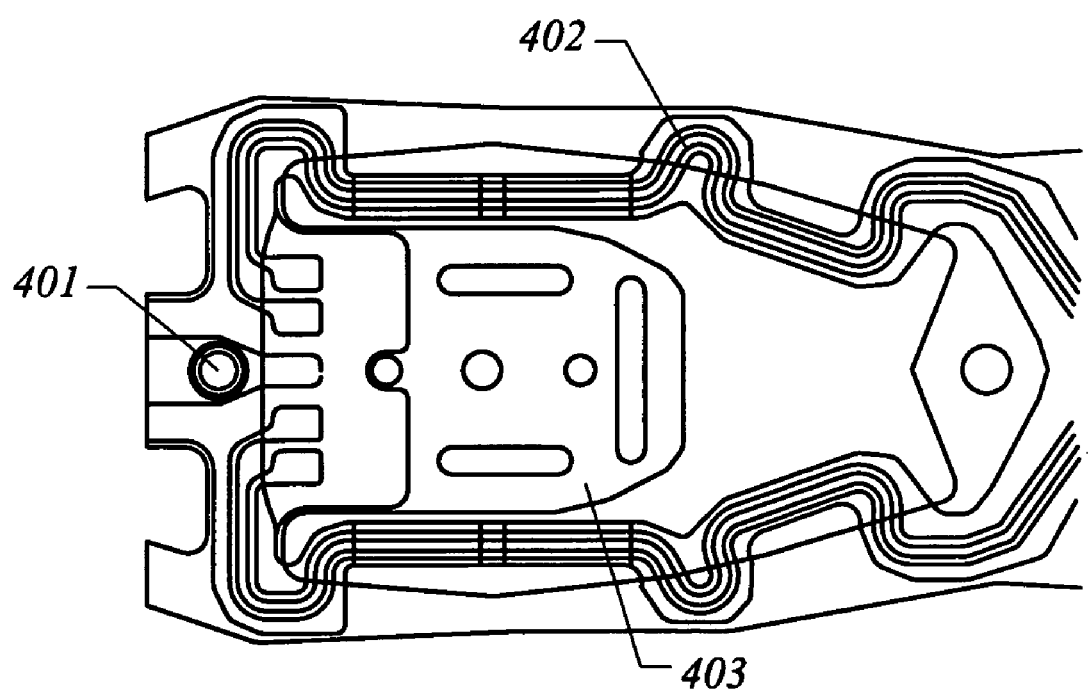
FIG. 4 illustrates, as an example, a trace gimbal with a ground feature according to an embodiment of the invention.

In FIG. 4, a trace gimbal with a ground feature 401 according to an embodiment of the invention includes conductive traces 402 and gimbal tongue 403. Gimbal tongue 403 is where the slider 101 is bonded to trace 402 with interconnects.

Figures 5, 6:
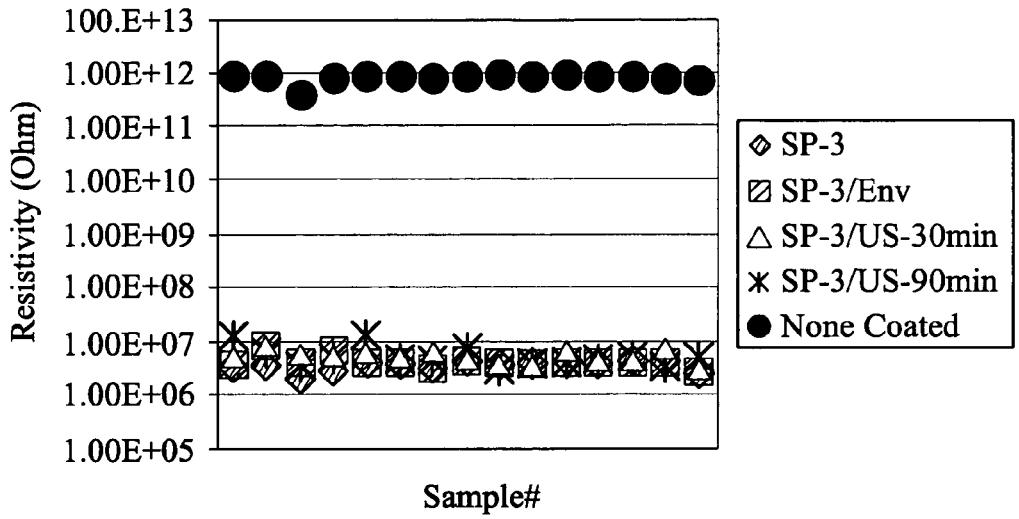
FIG. 5 presents resistivity experimental results for traces coated according to an embodiment of the invention while under environmental attacks.
FIG. 6 presents tribocharge experimental results for traces coated according to an embodiment of the invention while under environmental attack.

FIG. 5 compares trace surface resistance of an uncoated trace and a trace coated according to an embodiment of the invention. The plot shows the coated trace retains lower surface resistance even under environmental attack, which consisted of 85° C./85% relative humidity for 120 hours and ultrasonic cavitation for 90 minutes.

FIG. 6 shows tribocharge experimental results for traces coated according to an embodiment of the invention while under environmental attack. Under the tested conditions, tribocharge remained below 8 volts. A conventional polymer base coating would not exhibit this level of performance robustness. Environmental attack will degrade or peel off a conventional polymer coating, eventually losing a continuous ground loop. The current invention adopts a robust coating material and process to provide a continuous ground loop from the trace cover coat material to the ground plane. Ion bombardment ensures excellent bonding between the coating and base materials.

Figure 7:
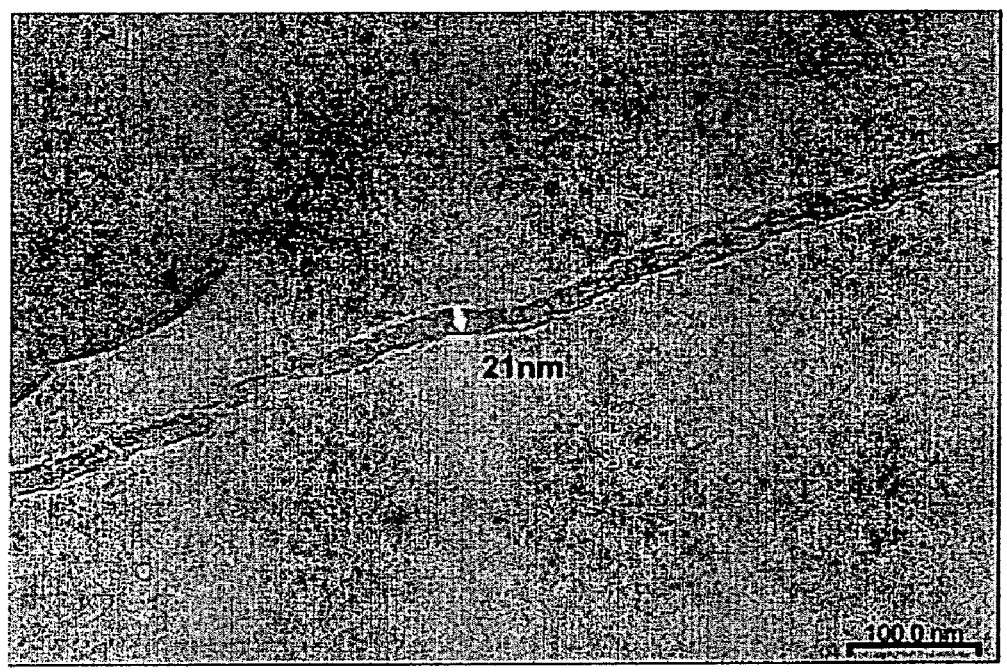
FIG. 7 is a transmission electron microscope image of a continuous film layer according to an embodiment of the invention.

FIG. 7 is a transmission electron microscope image of a continuous film layer according to an embodiment of the invention. FIG. 7 shows a 21 nanometer thick continuous film on top of a trace cover coat layer. In comparison, nano-scale coating using a conventional polymer is difficult to achieve and subject to unreliable coating integrity—any incomplete coating can create "hot spots" that degrade protection performance.

One of ordinary skill in the art would recognize many other variations, modifications, and alternatives. The above examples are merely illustrations, which should not unduly limit the scope of the claims herein. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A flexible circuit apparatus for electrostatic discharge protection comprising:
   a first dielectric layer over a stainless steel ground plane;
   at least one trace conductor on a surface of the first dielectric layer;
   a second dielectric layer over the at least one trace conductor and the first dielectric layer; and
   a flexible film coating consisting substantially of carbon deposited over the second dielectric layer,
   wherein the flexible film coating is one of amorphous carbon base material, crystalline carbon base material, or a combination of amorphous and crystalline carbon base material.

2. The apparatus of claim 1, wherein the carbon base film coating is deposited by an ion-deposition technique.

3. The apparatus of claim 2, wherein the ion-deposition technique is a filtered cathodic vacuum arc technique with a peak energy of at least 1 eV and a pressure of less than $10^{-3}$ Torr.

4. The apparatus of claim 1, wherein the carbon base film coating is electrostatically dissipative with a resistance range of $10^6$ to $10^{10}$ ohms.

5. The flexible circuit apparatus of claim 1, wherein the flexible film coating comprises tetrahedral amorphous carbon.

6. The flexible circuit apparatus of claim 1, wherein:
   said flexible film coating defines an outer layer over the flexible circuit apparatus; and
   said flexible film coating is grounded.

7. The flexible circuit apparatus of claim 1, wherein the flexible film coating is electrically separated from said trace conductor.

8. The apparatus of claim 1 wherein the flexible film coating consists of amorphous carbon base material, crystalline carbon base material, or a combination of amorphous and crystalline carbon base material.

9. A flexible circuit apparatus for electrostatic noise protection comprising:
   a dielectric layer over a stainless steel ground plane;
   a trench or via extending through the dielectric layer to the ground plane;
   at least one trace conductor on a surface of the dielectric layer; and
   a flexible film coating deposited over the at least one trace conductor and trench or via, wherein the at least one trace conductor is coupled to the ground plane through the film coating, wherein the flexible film coating consists substantially of electrically conductive amorphous carbon base material, electrically conductive crystalline carbon base material, or a combination of electrically conductive amorphous and electrically conductive crystalline carbon base material.

10. The apparatus of claim 9, wherein the carbon base film coating is deposited by an ion-deposition technique.

11. The apparatus of claim 9, wherein the flexible circuit provides grounding for a slider in a head gimbal assembly.

12. The apparatus of claim 9, wherein the flexible circuit provides grounding for a hard disk drive suspension assembly.

13. The apparatus of claim 9, wherein the film coating is deposited without forming a seed layer by means of an ion-deposition technique with peak energy of at least 1 eV and pressure less than $10^{-3}$ Torr.

14. The flexible circuit apparatus of claim 9 wherein the flexible film coating comprises tetrahedral amorphous carbon.

15. A method of forming a flexible circuit for electrostatic noise and discharge protection of a computer disk comprising:
   providing a first dielectric layer atop a stainless steel grounding substrate;
   providing a conductive substrate atop the first dielectric layer, the conductive substrate being in panel form;
   cleaning a surface of the conductive substrate;
   applying a first mask to the surface of the conductive substrate;
   depositing a conductive material, by a first ion-deposition process, onto the surface of the conductive substrate to form a ground path;
   applying a second mask to the surface of the conductive substrate;and
   providing a second dielectric layer atop said conductive substrate;
   depositing an ESD (electrostatic discharge) flexible dissipative material on the surface of the second dielectric layer by a second ion-deposition process,
   wherein the flexible dissipative material consists substantially of an amorphous carbon base material, a crystalline carbon base material, or a combination of amorphous and crystalline carbon base material.

16. The method of claim 15, wherein the first ion-deposition process is a filtered cathodic vacuum arc process.

17. The method of claim 15, wherein the second ion-deposition process is a filtered cathodic vacuum arc process.

18. The method of claim 15, wherein the step of depositing the conductive material is performed with a peak energy level of at least 1 eV and a pressure of lower than $10^{-3}$ Torr.

19. The method of claim 15, wherein the step of depositing the dissipative material is performed with a peak energy level of at least 1 eV and a pressure of lower than $10^{-3}$ Torr.

20. The method of claim 15, wherein the conductive material is at least one of tetrahedral amorphous carbon, titanium, copper, nickel, chromium, silver, or gold.

21. The method of claim 15, wherein the conductive material is at least one of an electrically conductive amorphous carbon, an electrically conductive crystalline carbon, or a combination of electrically conductive amorphous and crystalline carbon.

22. The method of claim 15 wherein the conductive material forms directly on a polyimide without forming a seed layer.

23. A flexible circuit apparatus for electrostatic discharge protection comprising:
   a first dielectric layer over a ground plane;
   at least one trace conductor on a surface of the first dielectric layer;
   a tetrahedral amorphous carbon film disposed over said trace conductor;
   a ground connection to said tetrahedral amorphous carbon film; and
   a second dielectric layer over said trace conductor;
   wherein said tetrahedral amorphous carbon film is ion-deposited on said second dielectric layer.

* * * * *